United States Patent
Fair et al.

(10) Patent No.: US 9,671,425 B1
(45) Date of Patent: Jun. 6, 2017

(54) TESTING APPARATUS USABLE IN SWITCHGEAR CABINET

(71) Applicant: EATON CORPORATION, Cleveland, OH (US)

(72) Inventors: Timothy Fair, Boiling Springs, SC (US); Daniel Edward Hrncir, Arden, NC (US)

(73) Assignee: EATON CORPORATION, Cleveland, OH (US)

( * ) Notice: Subject to any disclaimer, the term of this patent is extended or adjusted under 35 U.S.C. 154(b) by 0 days.

(21) Appl. No.: 14/955,185

(22) Filed: Dec. 1, 2015

(51) Int. Cl.
| G01R 31/02 | (2006.01) |
| G01R 1/04 | (2006.01) |
| H02B 1/30 | (2006.01) |
| G01R 31/327 | (2006.01) |

(52) U.S. Cl.
CPC ............ *G01R 1/04* (2013.01); *G01R 31/327* (2013.01); *H02B 1/306* (2013.01)

(58) Field of Classification Search
CPC .... G01R 1/04; G01R 31/327; G01R 31/3277; G01R 31/3272; G01R 31/3333; G01R 31/3336; H02B 1/06; H02B 1/04; H02B 1/21; H02B 1/36; H02B 1/056; H02B 1/20; H02B 13/02; H02B 11/18; H02B 11/133; H02B 11/24; H01H 71/08

USPC ......... 324/424, 537; 361/605, 608, 610–611, 361/634, 637, 652, 724, 727
See application file for complete search history.

(56) References Cited

U.S. PATENT DOCUMENTS

| 4,202,028 | A | 5/1980 | Baird |
| 6,205,017 | B1 * | 3/2001 | Wilkie, II ................ H02B 1/21 174/70 B |
| 7,141,747 | B2 * | 11/2006 | Dahl .................... H02B 11/133 200/50.21 |
| 7,903,393 | B2 * | 3/2011 | Buxton .................. H02B 11/24 200/50.21 |
| 2016/0036204 | A1 * | 2/2016 | Schroeder ............ H02B 11/133 200/50.22 |

* cited by examiner

*Primary Examiner* — Thang Le
(74) *Attorney, Agent, or Firm* — Eckert Seamans; Brij Agarwal; Philip Levy (57) ABSTRACT

A test apparatus that is usable with a switchgear cabinet is structured to mimic the operation of a circuit interruption device being received in the interior of the switchgear cabinet by providing a number of structures such as an engagement wall that engages a shutter assembly and moves it from a deployed state to an undeployed state. The engagement wall in the test apparatus has a number of openings formed therein that permit a number of electrical conductors and the relevant portions of the shutter assembly to be viewed from the exterior of the switchgear cabinet.

6 Claims, 13 Drawing Sheets

TESTING APPARATUS USABLE IN SWITCHGEAR CABINET

BACKGROUND

Field

The disclosed and claimed concept relates generally to electrical interruption equipment and, more particularly, to a testing apparatus that is usable with a switchgear cabinet.

Related Art

Circuit interruption equipment is well known in the relevant art for use in interrupting the flow of current in a protected portion of an electrical circuit. Numerous types of such circuit interruption devices exist and can include circuit breakers, vacuum interrupters, and numerous other types of devices known for such purposes.

Figure 1:
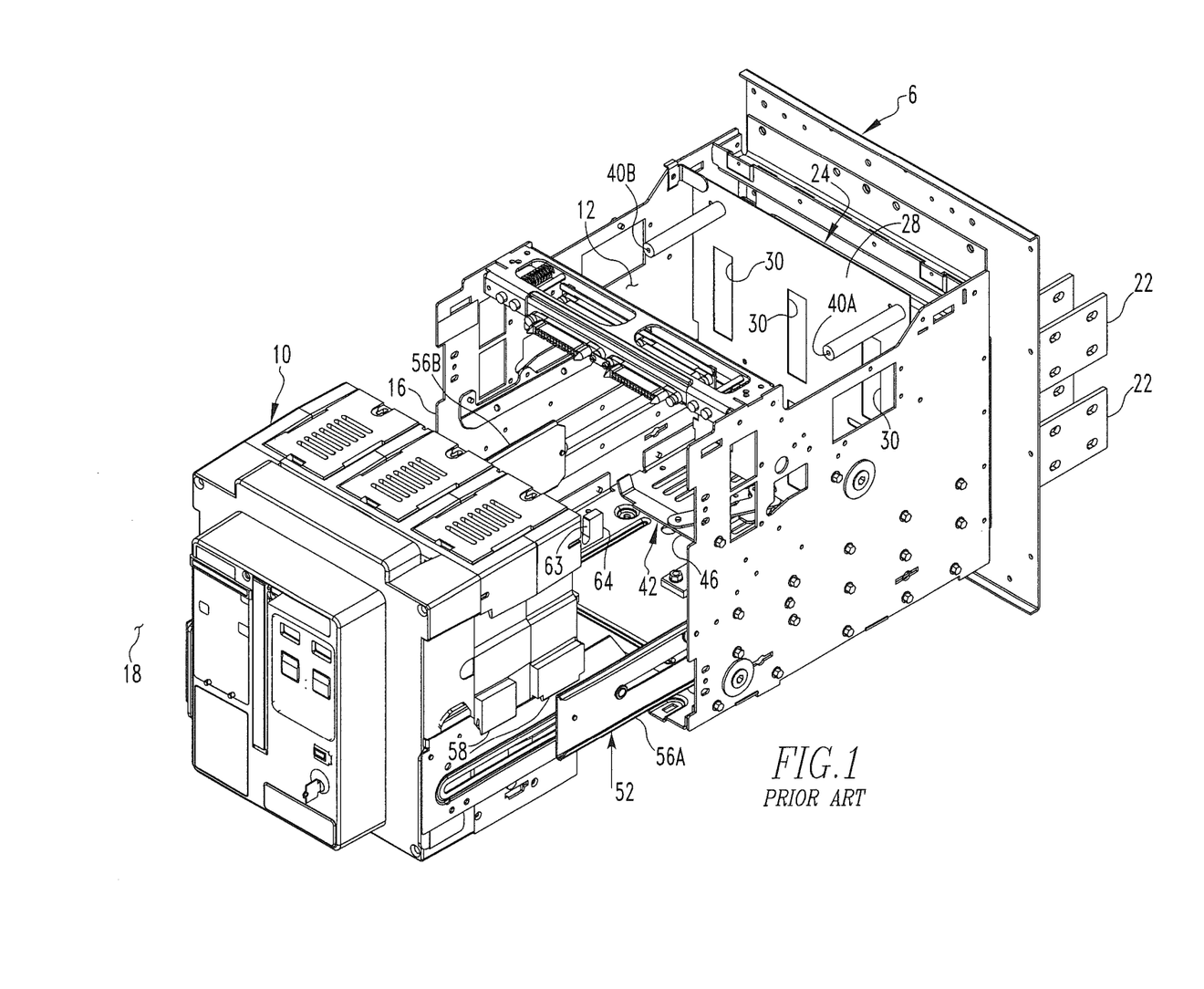
FIG. 1 is a depiction of a circuit interruption device situated on a support of a switchgear cabinet with the support being in an extended position and with a shutter assembly of the switchgear cabinet being in a deployed state.
Figure 2:
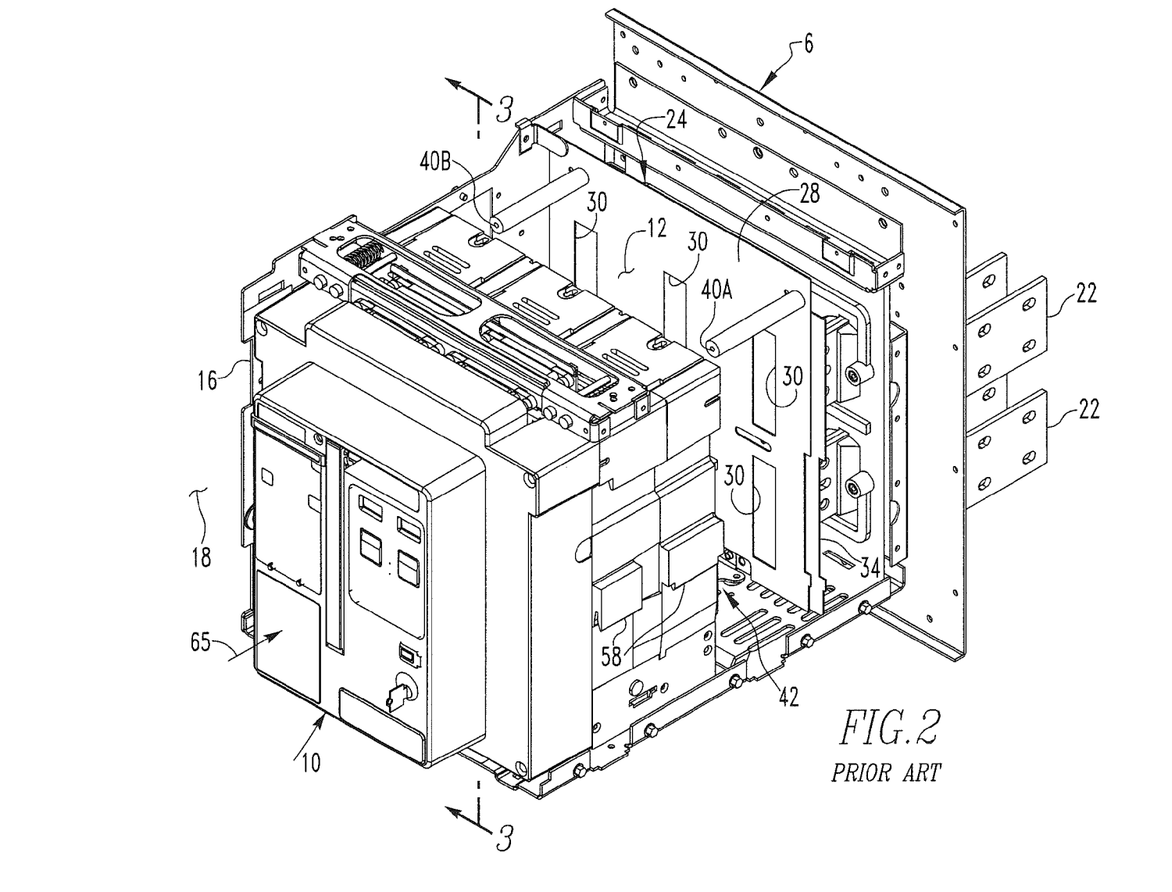
FIG. 2 is a view similar to FIG. 1, except depicting the circuit interruption device at least partially received in an interior of the switchgear cabinet and depicting for reasons of clarity a portion of the support having been removed.
Figure 3:
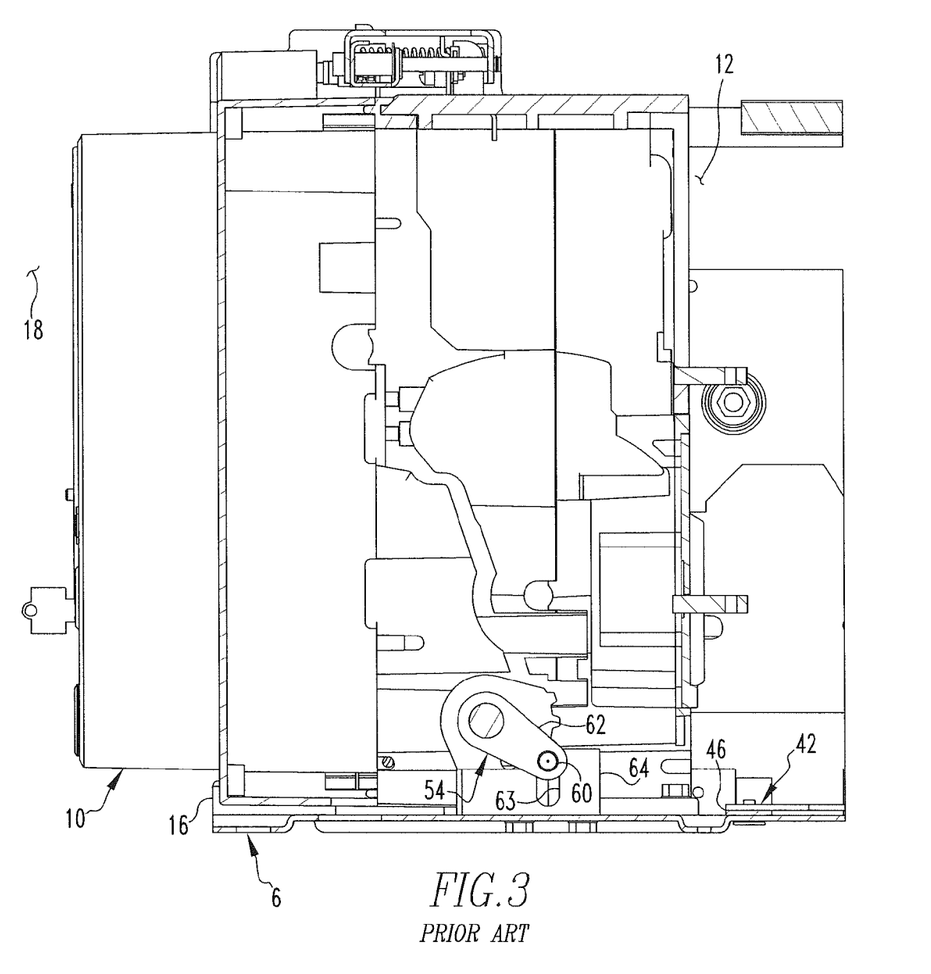
FIG. 3 is a sectional view as taken along line 3-3 of FIG. 2.
Figure 4:
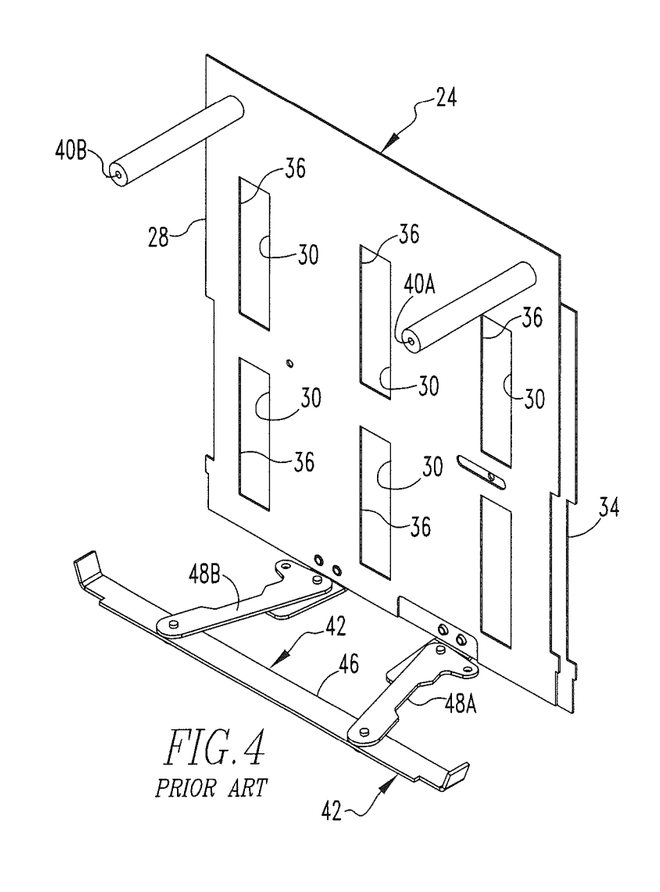
FIG. 4 is a depiction of the shutter assembly of FIG. 1 in the deployed state.
Figure 5:
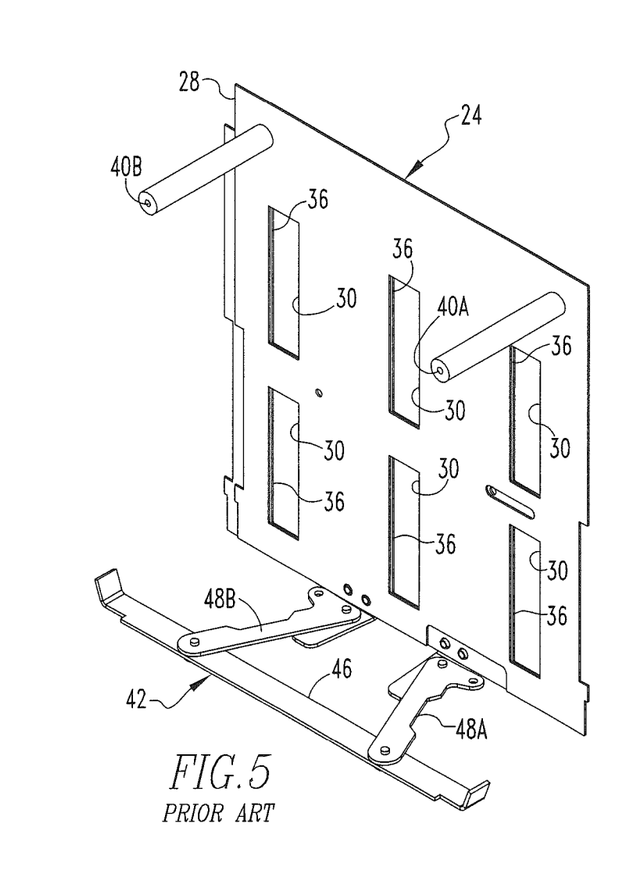
FIG. 5 is a view similar to FIG. 4, except depicting the shutter assembly in an undeployed state.
Figure 6:
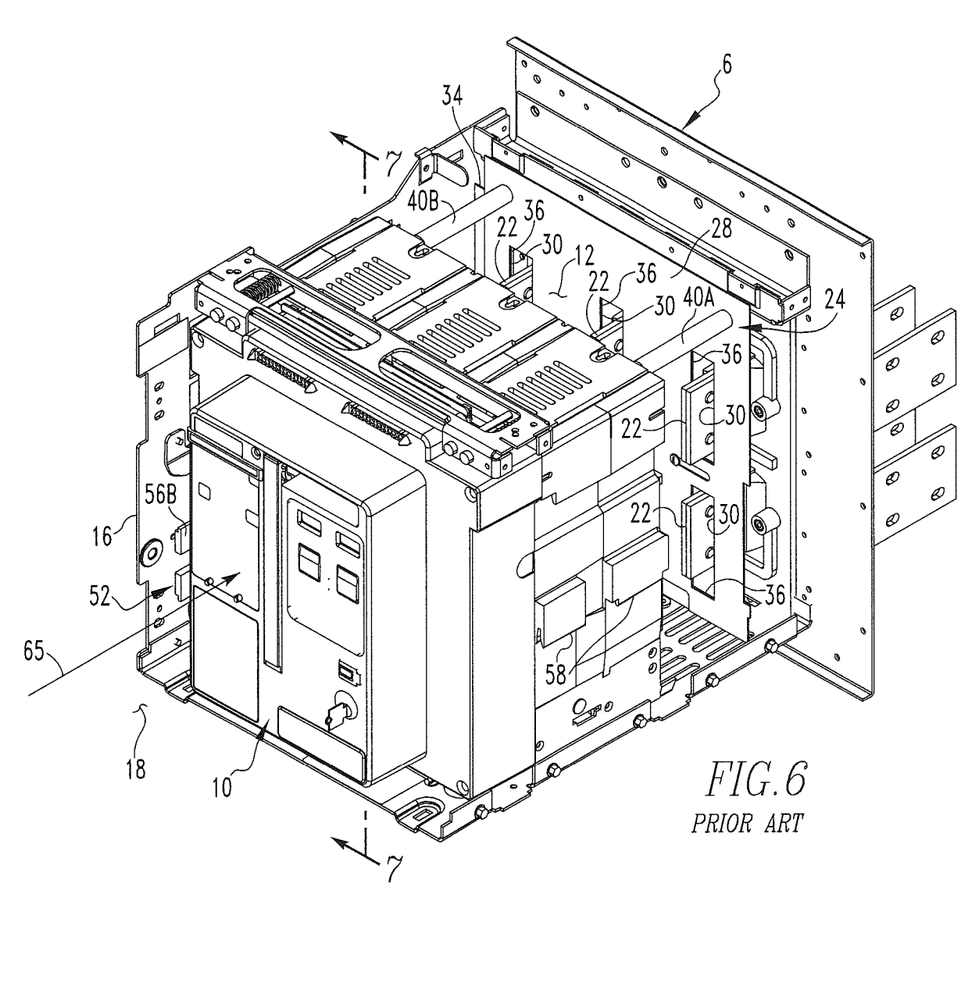
FIG. 6 is a view similar to FIG. 2, except depicting the circuit interruption device fully advanced into the interior and depicting the shutter assembly in the undeployed state of FIG. 5 and with a number of electrical conductors of the switchgear cabinet being received through a plurality of aligned first and second holes formed in the shutter assembly.
Figure 7:
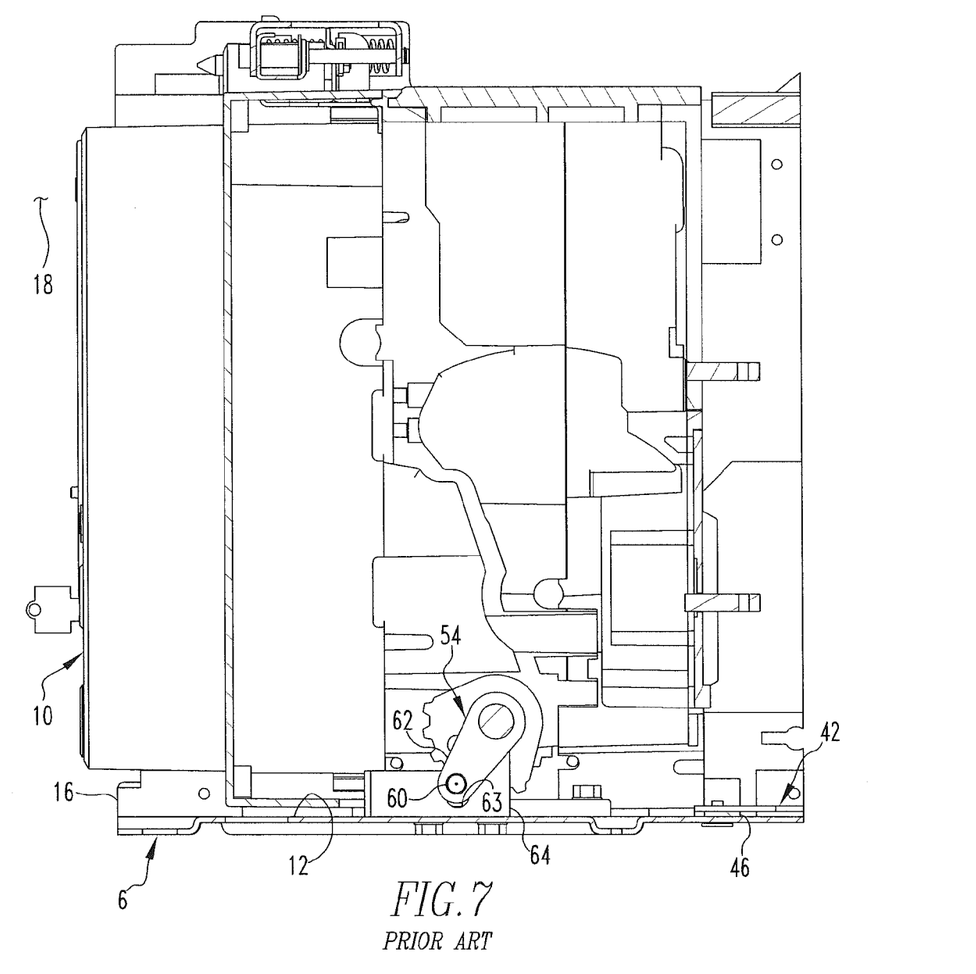
FIG. 7 is a sectional view as taken along line 7-7 of FIG. 6.

One type of circuit interruption system is a withdrawable circuit interruption system such as is depicted generally in FIGS. 1-7. Such a system employs a switchgear cabinet 6 and a circuit interruption device 10 that is mountable thereon and removable therefrom. The switchgear cabinet 6 has an interior 12 within which the circuit interruption device 10 is receivable through an access port 16 of the switchgear cabinet 6. The switchgear cabinet 6 has a number of electrical conductors 22 within the interior 12 that are covered by a shutter assembly 24 to protect personnel in the vicinity of the switchgear cabinet 6 from contact with the electrical conductors 22 in situations when the circuit interruption device 10 is removed from the interior 12 of the switchgear cabinet 6. As employed herein, the expression "a number of" and variations thereof shall refer broadly to any non-zero quantity, including a quantity of one. As can be seen in FIGS. 1-2 and 4-6, the shutter assembly 24 includes a first plate 28 having a plurality of first holes 30 formed therein, a second plate 34 (FIGS. 2 and 4-5) having a plurality of second holes 36 (FIG. 5) formed therein, a pair of abutments 40A and 40B affixed to the first plate 28, and an engagement apparatus 42 that is connected with the first and second plates 28 and 34. The engagement apparatus 42 is depicted in FIGS. 4-5 as including a push bar 46 and a pair of links 48A and 48B that extend between the push bar 46 and the first and second plates 28 and 34. The first and second plates 28 and 34 are cooperable with channels formed in the walls of the switchgear cabinet 6 to move the shutter assembly 24 between a deployed state, such as is depicted in FIGS. 1-2 and 4, and an undeployed state, such as is depicted in FIGS. 5-6. The shutter assembly 24 is spring biased toward the deployed state in which the first and second holes 30 and 36 are offset from one another such that the first and second plates 28 and 34 together form a shield between the electrical conductors 22 and the interior 12 of the switchgear cabinet 6. When the circuit interruption device 10 is removed from the interior 12, the shutter assembly 24 is therefore in the deployed state and covers the electrical conductors 22.

As is best shown in FIG. 1, the switchgear cabinet 6 has a support 52 that is movably situated within the interior 12 and that is movable between an extended position such as is depicted in FIG. 1 wherein a portion of the support 52 protrudes from the interior 12 into the exterior 8 of the switchgear cabinet 6 and a number of retracted positions 52 wherein the support 52 is situated within the interior 12. The support 52 includes a pair of telescoping rails 56A and 56B, and the circuit interruption device 10 includes a number of lugs 58 formed on an exterior surface of its housing. The lugs 58 are receivable on the rails 56A and 56B, such as when the support 52 is in the extended position shown in FIG. 1, wherein the shutter assembly is in its deployed state. As the rails 56A and 56B are telescoped into the interior 12 with the circuit interruption device 10 situated thereon, the circuit interruption device 10 is advanced farther into and along the interior 12 and begins to approach the shutter assembly 24, as is indicated generally in FIG. 2 wherein the circuit interruption device 10 has not yet made physical contact with the shutter assembly 24.

The circuit interruption device 10 includes a drive system 54 that is depicted generally in FIG. 3 and that includes a pin 60 that is situated on a pivotable crank 62. The pin 60 is receivable in a notch 63 that is formed in a structure 64 of the switchgear cabinet 6 that is disposed within the interior 12 of the switchgear cabinet 6. As the crank 62 is pivoted (in the clockwise direction from the perspective of FIGS. 3 and 7), the pin 60 is received in the notch 63, and the circuit interruption device 10 is advanced farther into the interior 12 to a point where the circuit interruption device 10 physically engages the abutments 40A and 40B and the push bar 46. Further advancement of the circuit interruption device 10 into the interior 12 causes the shutter assembly 24 to be corresponding advanced toward the electrical conductors 22 and to move the shutter assembly 24 from its deployed state to its undeployed state that is depicted generally in FIGS. 5 and 6. In the undeployed state, the first and second holes 30 and 36 are aligned with one another to thereby uncover the electrical conductors 22 and to permit finger clusters or other connection structures on the advancing face of the circuit interruption device 10 to be electrically engaged with the electrical conductors 22. It thus can be understood that by advancing the circuit interruption device 10 into the interior 12 by operating the drive system 54 to engage the pin 60 in the notch 63 and to simultaneously engage the advancing wall of the circuit interruption device 10 with the shutter assembly 24, the bias of the shutter assembly 24 is overcome, and the shutter assembly 24 is translated farther into the interior 12 while moving the shutter assembly 24 from the deployed state to the undeployed state and simultaneously receiving the electrical conductors 22 in the aligned first and second holes 30 and 36. Such a condition is depicted generally in FIG. 6.

While such circuit interruption systems have been generally effective for their intended purposes, they have not been without limitation. For instance, since the shutter assembly 24 is caused by the advancing circuit interruption device 10 to simultaneously move toward the electrical conductors 22 while translating the first and second plates 28 and 34 with respect to one another to move from its deployed state to its undeployed state, the proper operation of the components relies upon the shutter assembly 24 and the electrical conductors 22 being situated in pre-established positions with respect to one another. However, it is understood that potential limitations with the manufacturing process and damage that may be sustained by the switchgear cabinet 6 during transportation to its final location may result in improper positioning of the electrical conductors 22 or the shutter assembly 24 or both. Such misalignment can be a problem because it can inhibit the circuit interruption device 10 from electrically engaging the electrical conductors 22 and because an attempt to receive the circuit interruption device 10 into the interior 12 can cause the shutter assembly 24 to engage the electrical conductors 22 themselves and thereby cause damage. Additionally or alternatively, such misalignment cannot be observed from the exterior 18 of the switchgear cabinet 6 because of the visually obstructive presence of the circuit interruption device 10. As is understood from an arrow 65 that is depicted in FIGS. 2 and 6, the circuit interruption device 10 itself obstructs a view from the exterior 18 of the shutter assembly 24 in its undeployed state. Improvements therefore would be desirable.

SUMMARY

An improved test apparatus 4 that is usable with the switchgear cabinet 6 meets these and other shortcomings known in the relevant art. The test apparatus 4 is structured to mimic the operation of the circuit interruption device 10 being received in the interior 12 of the switchgear cabinet 10 by providing a number of structures such as an engagement wall 78 that engages the shutter assembly 24 and moves it from its deployed state to its undeployed state. The engagement wall 78 in the test apparatus has a number of openings 86 formed therein that permit the electrical conductors 22 and the relevant portions of the shutter assembly 24 to be viewed from the exterior 18 of the switchgear cabinet 6.

Accordingly, an aspect of the disclosed and claimed concept is to provide an improved test apparatus that is usable with a switchgear cabinet and which permits the operation of a shutter assembly in moving between deployed and undeployed states to be observed from the exterior of the switchgear cabinet.

Another aspect of the disclosed and claimed concept is to provide an improved test apparatus that is usable with a switchgear cabinet in place of a circuit interruption device and that permits the operation of a shutter assembly that otherwise would be blocked from view by a circuit interruption device to instead be observable from the exterior of the switchgear cabinet.

Accordingly, an aspect of the disclosed and claimed concept is to provide an improved test apparatus that is usable with a switchgear cabinet, the switchgear cabinet having an interior and having an access port through which a circuit interruption device is receivable into the interior from the exterior of the cabinet, the switchgear cabinet having a number of electrical conductors and a shutter assembly that are situated within the interior, the shutter assembly being operable to move the shutter assembly between a deployed state and an undeployed state responsive to the shutter assembly being engaged by the circuit interruption device, the shutter assembly in the deployed state being in a condition covering the number of electrical conductors and resisting the number of electrical conductors from being visually observed through the access port from a location situated at an exterior of the switchgear cabinet, the shutter assembly in the undeployed state being in another condition uncovering the number of electrical conductors. The test apparatus can be generally stated as including a frame that can be generally stated as including at least a first wall having a number of openings formed therein, the frame being movable between a first position disengaged from the mechanism and a second position received at least partially in the interior and engaged with the mechanism to move the shutter assembly between the deployed state and the undeployed state and to thereby move the shutter assembly between the condition covering the number of electrical conductors and the another condition uncovering the number of electrical conductors, the number of openings in the second position at least partially overlying the number of electrical conductors and permitting the electrical conductors to be visually observed through the number of openings and through the access port from a location situated at the exterior of the switchgear cabinet.

BRIEF DESCRIPTION OF THE DRAWINGS

A further understanding of the disclosed and claimed concept can be gained from the following Description when read in conjunction with the accompanying drawings in which:

Similar numerals refer to similar parts throughout the specification.

DESCRIPTION

An improved test apparatus 4 in accordance with the disclosed and claimed concept is depicted in FIGS. 8-14. The test apparatus 4 is usable with the switchgear cabinet 6 that is depicted in FIGS. 1-7, for example, and advantageously permits the operation of the shutter assembly 24 and its physical interaction with the electrical conductors 22 to be observed from the exterior 18 of the switchgear cabinet 6. In effect, the test apparatus 4 is configured to take the place of the circuit interruption device 10 which, for the reasons set forth above, obstructs a view of the shutter assembly 24 and the electrical conductors 22 from the exterior through the access port 16. As will be set forth in greater detail below, the test apparatus 4 advantageously engages the shutter assembly 24 in the same fashion as would the circuit interruption device 10, except that the test apparatus 4 is advantageously configured to not obstruct the shutter assembly 24 and the electrical conductors 22 and rather advantageously permits them and their operation to be observed from the exterior 18 of the switchgear cabinet 6.

Figure 8:
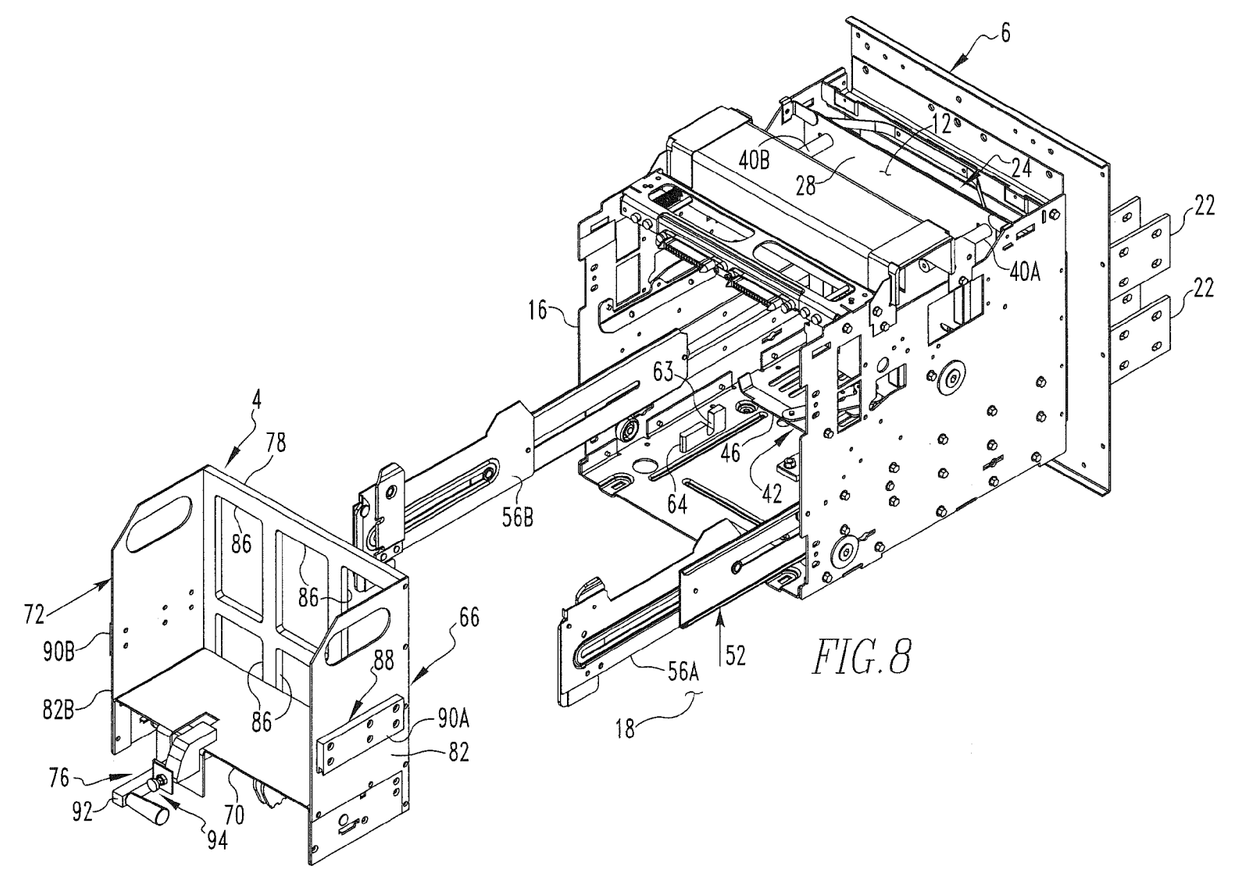
FIG. 8 is another view of the switchgear cabinet of FIG. 1, except additionally depicting an improved test apparatus in accordance with the disclosed and claimed concept being spaced from the support.
Figure 9:
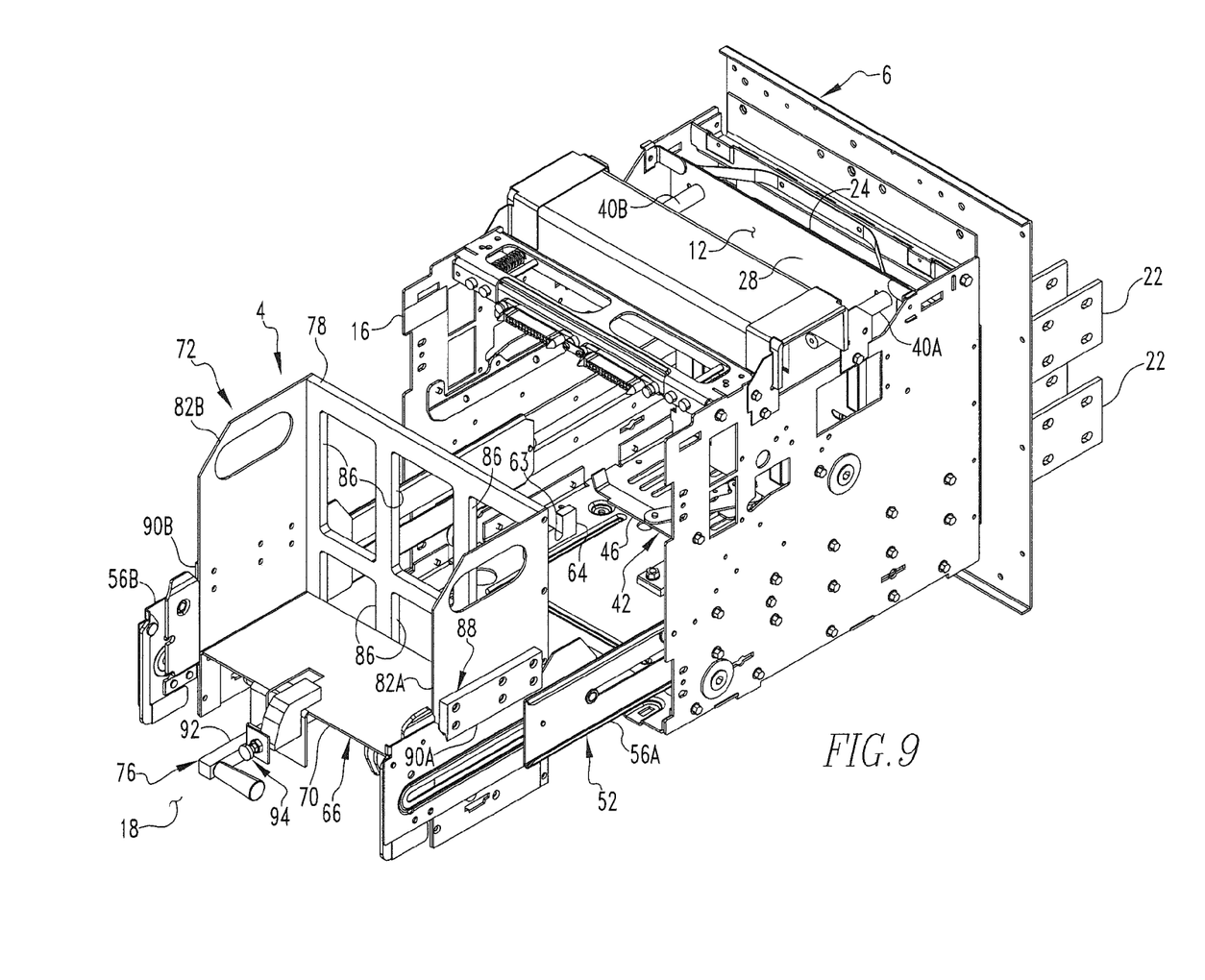
FIG. 9 is a view similar to FIG. 8, except depicting the test apparatus received on the support of the switchgear cabinet.

As can be understood from FIGS. 8 and 9, the test apparatus 4 can be said to include a frame 66 that includes a base 70 and a wall apparatus 72. The test apparatus 4 further includes a drive mechanism 76 that is situated on the base 70 and that is cooperable with the structure 64 of the switchgear cabinet 6 to permit the test apparatus 4 to be advanced into the interior 12 and to operate the shutter assembly 24 between the deployed and undeployed states in a fashion similar to the way in which the drive system 54 of the circuit interruption device 10 advanced it to cause the change in state of the shutter assembly 24.

The wall apparatus 72 is situated on the base 70 and includes an engagement wall 78 and a pair of sidewalls 82A and 82B. The engagement wall 78 has a plurality of openings 86 formed therein which can be said to overlie the electrical conductors 22 and the aligned first and second holes 30 and 36 when the test apparatus 4 is fully advanced into the switchgear cabinet 6 and has engaged the shutter assembly 24 and moved it to its undeployed state.

The wall apparatus 72 further includes a lug apparatus 88 that includes a pair of lugs 90A and 90B that are situated on the sidewalls 82A and 82B, respectively. The lugs 90A and 90B are receivable on the rails 56A and 56B, respectively, of the support 52 and thus support the test apparatus 4 on the support 52 during movement of the support 52 between the extended and retracted positions, such as is depicted in FIGS. 8-10 and 13. It is noted that the rail 56A is removed from FIGS. 10 and 13 for reasons of clarity. The lugs 90A and 90B are mirror images of one another, as are the rails 56A and 56B.

Figure 11:
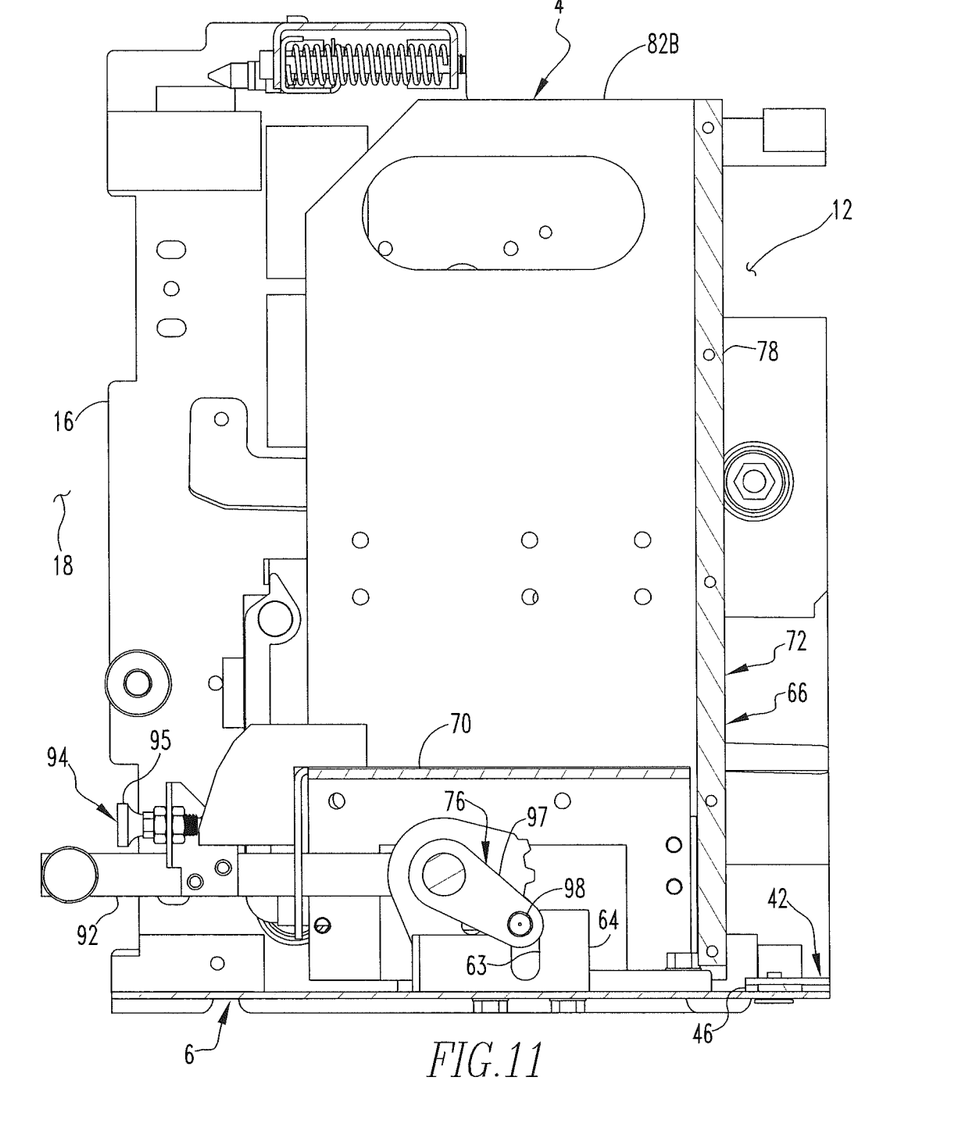
FIG. 11 is a sectional view as taken along line 11-11 of FIG. 10.
Figure 12:
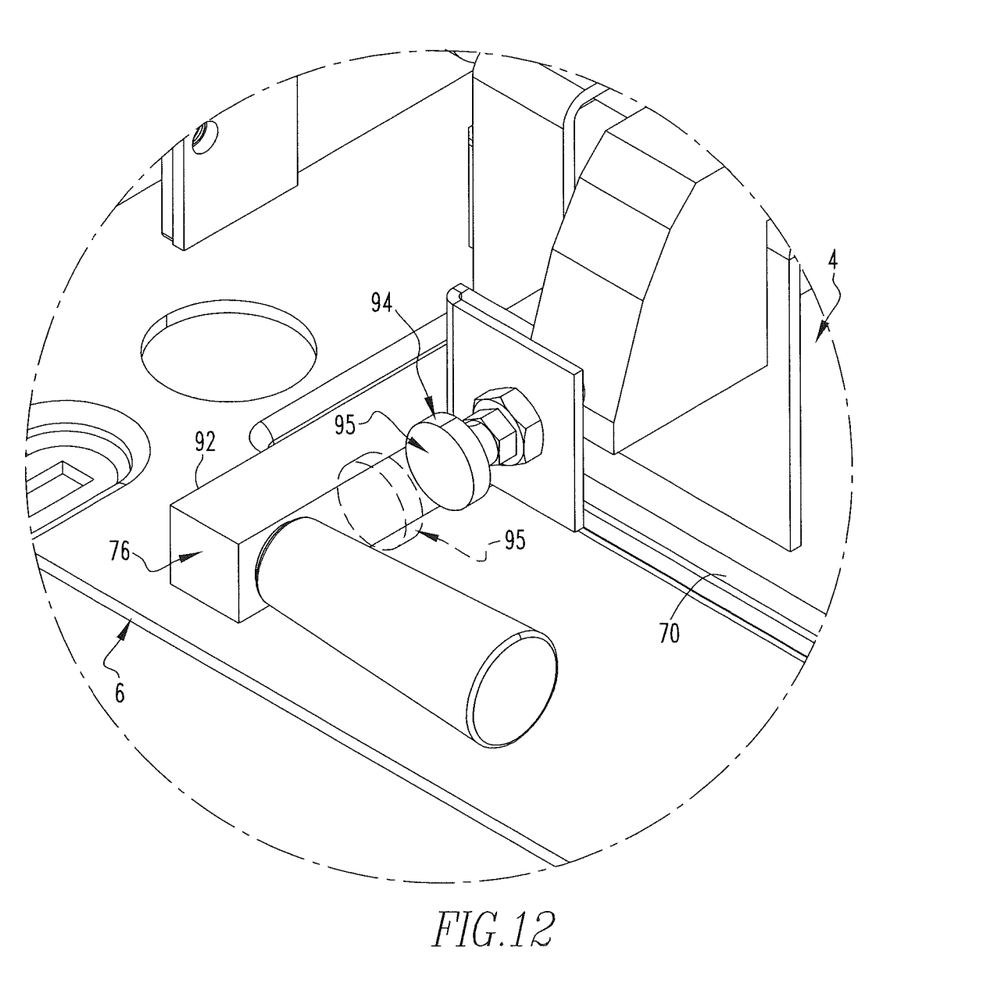
FIG. 12 is an enlarged view of the indicated portion of FIG. 10.

The drive mechanism 76 includes an arm 92 that is pivotably situated on the base 70 and further includes a lock 94 that is depicted in FIG. 12 as including a plunger that is movable between a locked position that is depicted in solid lines and an unlocked position that is depicted in dashed lines in FIG. 12. The plunger 95 in the locked position is received in a receptacle 96 (FIG. 13), and in so doing the lock 94 retains the arm 92 in a disengaged position such as is depicted generally in FIGS. 8-12. As can be understood from FIGS. 11 and 14, the drive mechanism 76 further includes a crank 97 that is mechanically connected with and operated by the arm 92 and that is pivotable with respect to the base 70. The crank 97 is pivotable to move a pin 98 of the drive mechanism 76 that is situated on the free end of the crank 97 between a first position disengaged from the notch 63 formed on the structure 64 and a second position engaged with the notch 63. When the lock 94 is in the locked position of FIGS. 8-10 and 12, the plunger 95 is received in the receptacle 96, and the pin 98 remains in a condition unreceived in the notch 63. However, when the plunger 95 is moved to the unlocked position that is depicted in dashed lines in FIG. 12, the plunger 95 is withdrawn from the receptacle 96, and the arm 92 can be pivoted with respect to the base 70 from the disengaged position that is depicted generally in FIGS. 8-12 to an engaged position that is depicted generally in FIGS. 13-14. In the depicted exemplary embodiment, the plunger 95 is spring-biased toward the locked position that is depicted in solid lines.

Figure 10:
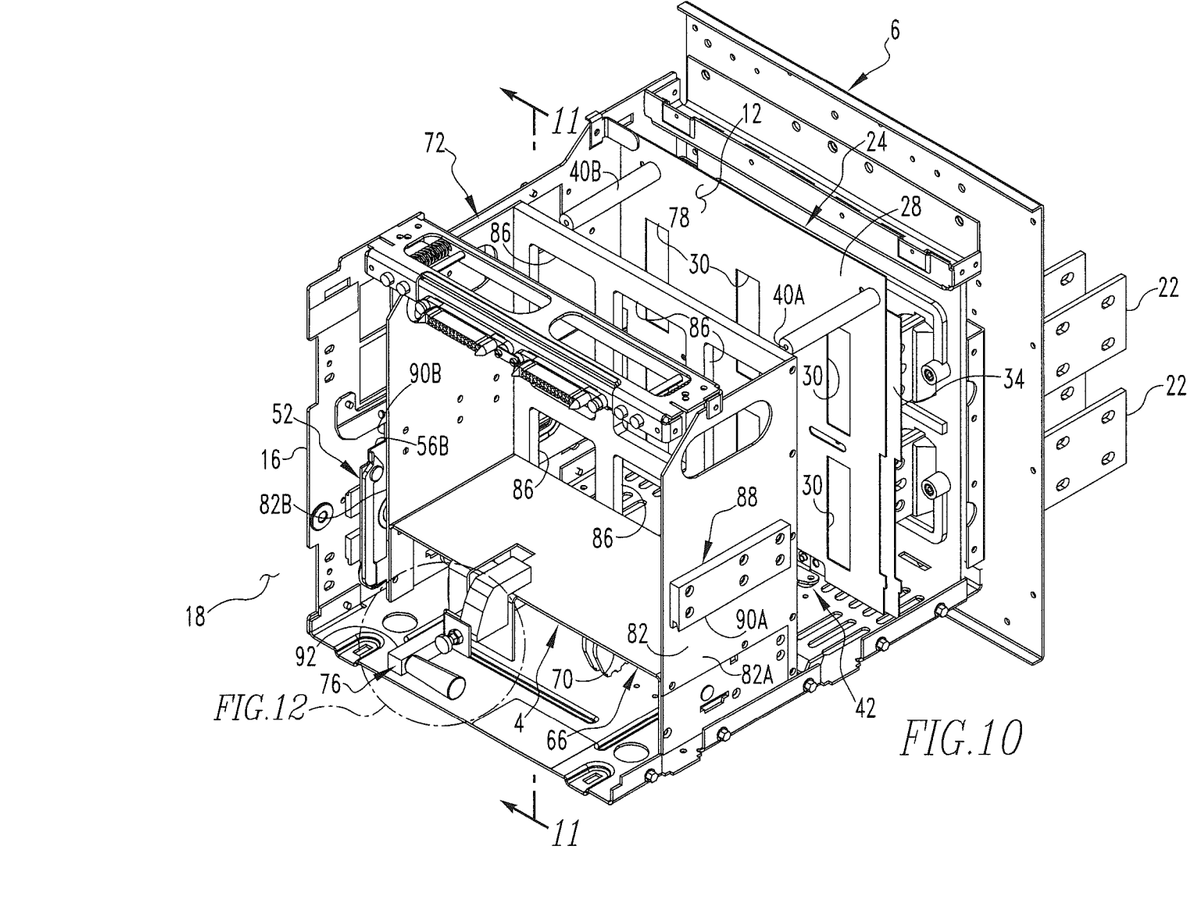
FIG. 10 is a view similar to FIG. 9, except depicting the test apparatus at least partially situated in the interior of the switchgear cabinet and depicting for reasons of clarity a portion of the support having been removed.
Figure 13:
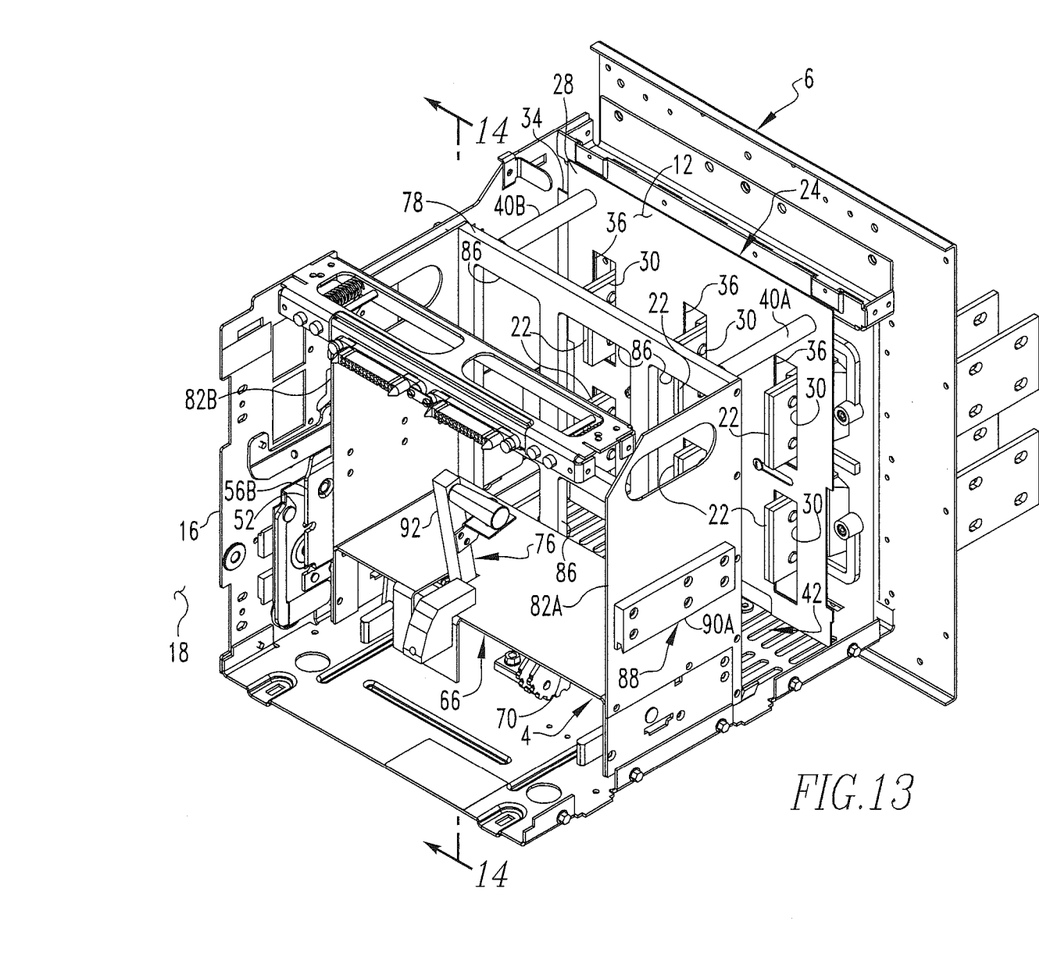
FIG. 13 is a view similar to FIG. 10, except depicting the test apparatus fully advanced along the interior of the switchgear cabinet and depicting the shutter assembly in the same undeployed state as is depicted in FIG. 5 with the electrical conductors being received through aligned first and second holes of the shutter assembly.
Figure 14:
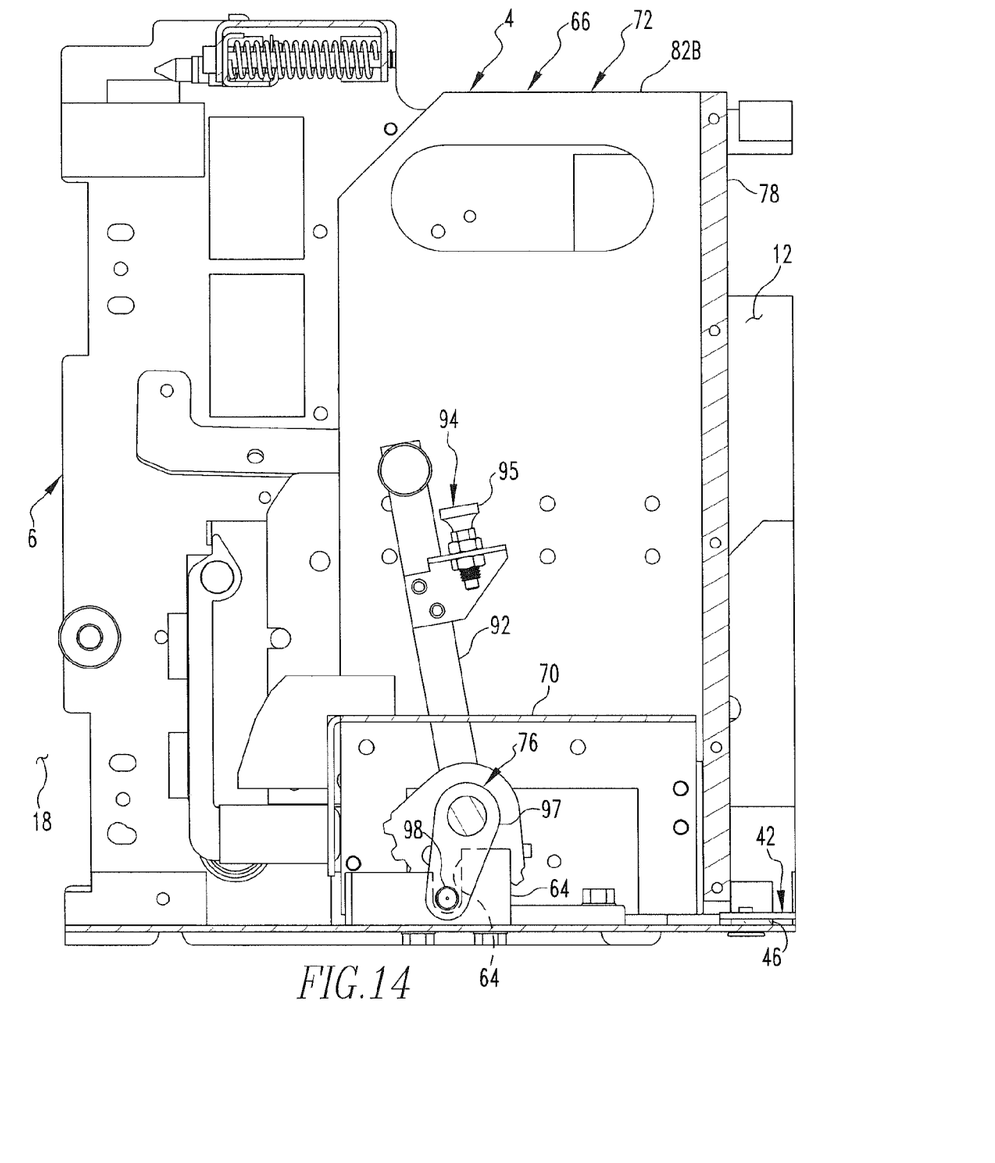
FIG. 14 is a sectional view as taken along line 14-14 of FIG. 13.

When the arm 92 is pivoted from the disengaged position depicted generally in FIGS. 10-11 to the engaged position depicted generally in FIGS. 13-14, the engagement of the pin 98 with the notch 63 formed in the structure 64 causes the engagement wall 78 and the base 70 to engage the abutments 40A and 40B and the push bar 46 in a fashion similar to the way in which the circuit interruption device 10 engages the abutments 40A and 40B and the push bar 46 when it is situated on the support 52 and is being advanced along the interior 12. That is, the engagement wall 78 mechanically engages the abutments 40A and 40B, and the base 70 mechanically engages the push bar 46, and such mechanical engagement between the structures of the test apparatus 4 and the corresponding engaged structures of the shutter assembly 24 causes the shutter assembly 24 to be moved to its undeployed state. As mentioned elsewhere herein, the first and second holes 30 and 36 become aligned with one another and the electrical conductors are received through the aligned pairs of first and second holes 30 and 36 in the undeployed state of the shutter assembly 24. Since the openings 86 formed in the engagement wall 78 are aligned with the electrical conductors 22 and the aligned first and second holes 30 and 36, the operation of the shutter assembly 24 in moving between the deployed and undeployed states can be observed through the openings 86 from the exterior 18 of the switchgear cabinet 6 and through the access port 16. The interplay between the shutter assembly 24 and the electrical conductors 22 can likewise be observed. That is, the shutter assembly 24 can be visually observed moving between the deployed and undeployed states, and the electrical conductors 22 can be observed being received in the aligned pairs of first and second holes 30 and 36, and this can be observed through the openings 86 from the exterior 18 of the switchgear cabinet 6 and through the access port 16.

It thus can be seen that the test apparatus 4 with its openings 86 formed therein advantageously permits the shutter assembly 24 and the electrical conductors 22 to be observed from the exterior 18 of the switchgear cabinet 6, which enables problems with the switchgear cabinet 6 to be identified prior to the circuit interruption device 10 being racked into the interior 12, thereby avoiding greater damage to the switchgear cabinet 6. Additionally, the proper functioning of the shutter assembly 24 and its proper cooperation with the electrical conductors 22 can likewise be observed, which advantageously reduces the risk to nearby personnel due to possible electrical shorts within the interior 12 such as might be occasioned by switching the circuit interruption device 10 to its ON condition or by simply racking the circuit interruption device 10 into the interior 12 if the shutter assembly 24 or the electrical conductors 22 were not working or cooperating properly. The improved test apparatus 4 is inexpensive to manufacture and functions in the same way as the circuit interruption device 10 being received in the interior 12 and becoming engaged with the shutter assembly 24. The test apparatus 4 thus advantageously provides a low cost system for checking the operation of the switchgear cabinet 6. Other advantageous will be apparent.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A test apparatus that is usable with a switchgear cabinet, the switchgear cabinet having an interior and having an access port through which a circuit interruption device is receivable into the interior from an exterior of the switchgear cabinet, the switchgear cabinet having a number of electrical conductors and a shutter assembly that are situated within the interior, the shutter assembly being operable to move the shutter assembly between a deployed state and an undeployed state responsive to the shutter assembly being engaged by the circuit interruption device, the shutter assembly in the deployed state being in a condition covering the number of electrical conductors and resisting the number of electrical conductors from being visually observed through the access port from a location situated at the exterior of the switchgear cabinet, the shutter assembly in the undeployed state being in another condition uncovering the number of electrical conductors, the test apparatus comprising:

a frame that comprises at least a first wall having a number of openings formed therein, the frame being movable between a first position disengaged from the shutter assembly and a second position received at least partially in the interior and engaged with the shutter assembly to move the shutter assembly between the deployed state and the undeployed state and to thereby move the shutter assembly between the condition covering the number of electrical conductors and the another condition uncovering the number of electrical conductors, the number of openings in the second position at least partially overlying the number of electrical conductors and permitting the electrical conductors to be visually observed through the number of openings and through the access port from the location situated at the exterior of the switchgear cabinet.

2. The test apparatus of claim 1 wherein the frame further comprises a base and a drive mechanism, the drive mechanism and the at least first wall being situated on the base, the drive mechanism being engageable with a corresponding structure on the switchgear cabinet and being operable to move the frame toward the second position.

3. The test apparatus of claim 2 wherein the drive mechanism comprises an arm that is movable with respect to the base between a disengaged position and an engaged position, the shutter assembly being in the deployed state in the disengaged position of the arm, the frame being in the second position in the engaged position of the arm.

4. The test apparatus of claim 3 wherein the drive mechanism further comprises a lock that is movable between a locked position and an unlocked position, the lock in the locked position retaining the arm in the disengaged position, the lock in the unlocked position permitting the arm to move between the disengaged and engaged positions.

5. The test apparatus of claim 3 wherein the arm is pivotable with respect to the base between the disengaged and engaged positions.

6. The test apparatus of claim 1 wherein the switchgear cabinet comprises a support that is movable between an extended position and a retracted position, the support in the retracted position being situated within the interior, the support in the extended position protruding from the interior through the access port to the exterior of the switchgear cabinet, the support being structured to receive thereon the circuit interruption device and to move the circuit interruption device between an uninstalled position when the support is in the extended position and an installed position when the support is in the retracted position, and wherein the frame further comprises a lug apparatus that is receivable on the support and is structured to permit the frame to be carried by the support between the extended and retracted positions to move the frame between the first and second positions.

\* \* \* \* \*